United States Patent
Kuroda et al.

(10) Patent No.: US 9,352,409 B2
(45) Date of Patent: May 31, 2016

(54) SCREEN PRINTING MACHINE AND ELECTRONIC COMPONENT MOUNTING SYSTEM

(71) Applicant: Panasonic Intellectual Property Management Co., Ltd., Osaka (JP)

(72) Inventors: Seiya Kuroda, Yamanashi (JP); Hachiro Nakatsuji, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/534,697

(22) Filed: Nov. 6, 2014

(65) Prior Publication Data

US 2015/0129640 A1 May 14, 2015

(30) Foreign Application Priority Data

Nov. 12, 2013 (JP) ................................. 2013-233736

(51) Int. Cl.
| | |
|---|---|
| B23K 37/00 | (2006.01) |
| B23K 3/06 | (2006.01) |
| B41F 15/08 | (2006.01) |
| B41F 15/26 | (2006.01) |
| B41F 15/42 | (2006.01) |
| B41F 15/46 | (2006.01) |
| H05K 3/12 | (2006.01) |
| H05K 3/34 | (2006.01) |

(52) U.S. Cl.
CPC ........... *B23K 3/0638* (2013.01); *B41F 15/0881* (2013.01); *B41F 15/26* (2013.01); *B41F 15/426* (2013.01); *B41F 15/46* (2013.01); *H05K 3/1233* (2013.01); *H05K 3/3484* (2013.01); *H05K 2203/0139* (2013.01)

(58) Field of Classification Search
None
See application file for complete search history.

(56) References Cited

U.S. PATENT DOCUMENTS

| | | | | | |
|---|---|---|---|---|---|
| 4,589,336 | A | * | 5/1986 | Klemm | 101/124 |
| 5,201,452 | A | * | 4/1993 | Takahashi et al. | 228/8 |
| 5,476,039 | A | * | 12/1995 | Hiruta et al. | 101/123 |
| 5,479,854 | A | * | 1/1996 | Chikahisa et al. | 101/123 |
| 5,649,479 | A | * | 7/1997 | Hoffman | 101/123 |
| 5,694,843 | A | * | 12/1997 | Chen | 101/123 |
| 6,237,490 | B1 | * | 5/2001 | Takahashi et al. | 101/129 |
| 6,494,132 | B1 | * | 12/2002 | Sano et al. | 101/123 |
| 6,789,720 | B2 | * | 9/2004 | Uchida et al. | 228/22 |
| 8,152,049 | B2 | * | 4/2012 | Morita et al. | 228/249 |

(Continued)

FOREIGN PATENT DOCUMENTS

| | | | | | |
|---|---|---|---|---|---|
| JP | | 59185651 A | * | 10/1984 | ............. B41F 15/42 |
| JP | | 11-042763 A | | 2/1999 | |
| WO | WO 2012173059 A1 | * | 12/2012 | |

*Primary Examiner* — Kiley Stoner
(74) *Attorney, Agent, or Firm* — Pearne & Gordon LLP

(57) ABSTRACT

A screen printing machine for forming a print of paste supplied to a mask plate having pattern holes, includes: a filling squeegee which is held to have a given clearance with respect to the mask plate, and which fills the pattern holes with the paste by moving the filling squeegee relative to the mask plate in a printing direction; and an urging member which urges the filling squeegee toward the mask plate such that at least the given clearance is maintained. The screen printing machine further includes a scraping squeegee which is held to maintain a given interval from the filling squeegee in the printing direction, and which scraps off paste remaining on the mask plate after passage of the filling squeegee by moving the scraping squeegee together with the filling squeegee in the printing direction.

6 Claims, 15 Drawing Sheets

(56) References Cited

U.S. PATENT DOCUMENTS

| | | | |
|---|---|---|---|
| 8,342,381 B2* | 1/2013 | Sumioka | 228/102 |
| 8,640,615 B2* | 2/2014 | Miyahara et al. | 101/123 |
| 2001/0008101 A1* | 7/2001 | Ooe | 101/123 |
| 2001/0032556 A1* | 10/2001 | Ishida et al. | 101/129 |
| 2001/0038882 A1 | 11/2001 | Onishi et al. | |
| 2002/0108513 A1 | 8/2002 | Onishi et al. | |
| 2004/0035306 A1* | 2/2004 | Onishi et al. | 101/123 |
| 2004/0237813 A1* | 12/2004 | Maeda et al. | 101/123 |
| 2007/0262118 A1* | 11/2007 | Morita et al. | 228/101 |
| 2007/0272100 A1* | 11/2007 | Chen | 101/123 |
| 2008/0121124 A1* | 5/2008 | Sato | 101/123 |
| 2008/0289518 A1* | 11/2008 | Inoue et al. | 101/123 |
| 2009/0158943 A1* | 6/2009 | Kobayashi | 101/123 |
| 2010/0000428 A1* | 1/2010 | Chen | 101/123 |
| 2010/0200284 A1* | 8/2010 | Seki et al. | 174/260 |
| 2011/0017080 A1* | 1/2011 | Miyahara et al. | 101/123 |
| 2011/0023966 A1* | 2/2011 | Watanabe et al. | 137/1 |
| 2011/0132212 A1* | 6/2011 | Kondo et al. | 101/123 |
| 2011/0162202 A1* | 7/2011 | Miyahara et al. | 29/832 |
| 2011/0219966 A1* | 9/2011 | Willshere | 101/123 |
| 2013/0239829 A1* | 9/2013 | Kobayashi et al. | 101/123 |
| 2013/0239830 A1* | 9/2013 | Tomomatsu et al. | 101/123 |
| 2014/0020579 A1* | 1/2014 | Sumioka et al. | 101/123 |
| 2014/0073088 A1* | 3/2014 | Maeda et al. | 438/107 |
| 2014/0102322 A1* | 4/2014 | Tomomatsu et al. | 101/123 |
| 2014/0130940 A1* | 5/2014 | Okada | 148/24 |
| 2014/0182464 A1* | 7/2014 | Zhang | 101/123 |
| 2014/0208587 A1* | 7/2014 | Maeda et al. | 29/832 |
| 2014/0231492 A1* | 8/2014 | Saeki et al. | 228/180.22 |
| 2014/0318393 A1* | 10/2014 | Kobayashi et al. | 101/123 |
| 2014/0318394 A1* | 10/2014 | Tomomatsu et al. | 101/123 |
| 2014/0366754 A1* | 12/2014 | Kobayashi et al. | 101/123 |
| 2015/0075721 A1* | 3/2015 | Mantani et al. | 156/387 |
| 2015/0090770 A1* | 4/2015 | Mantani et al. | 228/102 |

* cited by examiner

SCREEN PRINTING MACHINE AND ELECTRONIC COMPONENT MOUNTING SYSTEM

BACKGROUND

1. Technical Field

An aspect of the present invention relates to a screen printing machine for forming a print of paste such as cream solder on a board. Another aspect of the present invention relates to an electronic component mounting system including the screen printing machine.

2. Description of Related Art

Screen printing is known as a method for forming a print of paste such as cream solder or conductive paste on a board in an electronic component mounting process. In this method, a paste print is formed on a board through pattern holes that are formed so as to conform to print subject portions. A paste print is formed on a board that is set on the bottom surface of a mask plate by filling the pattern holes with paste by a squeegeeing operation of moving a spatula-shaped squeegee member in a horizontal direction with its bottom end pressed against the mask plate.

In recent years, with the demand of productivity increase and increased difficulty of printing due to reduction of the pitches of printing portions on boards, it has become an important issue to supply sufficient amounts of paste to printing portions even in the case of a high-speed squeegeeing operation. One means for satisfying this requirement is a method that uses two kinds of squeegee members, that is, a filling squeegee and a scraping squeegee (refer to JP-A-H11-042763, for example). In the method disclosed in JP-A-H11-042763, two scraping squeegees are provided, which are elevated or lowered being driven via drive shafts of a vertical driving device. Further, a filling squeegee which is also elevated or lowered being driven via a drive shaft of the vertical driving device is provided between the two scraping squeegees.

In a squeegeeing operation, the filling squeegee is moved over the mask plate in a state that a prescribed clearance is set between the bottom end of the filling squeegee and the mask plate. This makes it possible to supply sufficient amounts of paste to printing portions on a board by increasing the filling pressure at the time of filling the pattern holes with paste by means of the filling squeegee. Paste remaining on the mask plate after passage of the filling squeegee is scraped off by the scraping squeegees.

SUMMARY

In screen printing using the above filling squeegee, to keep the print quality constant, it is important to set the clearance between the bottom end of the filling squeegee and the mask plate. However, in the above related art technique, the height of the filling squeegee is adjusted such that a control device causes the drive shaft of the vertical driving device to go up or down on the basis of output information of a reaction detector attached to the drive shaft. This results in problems that the machine becomes complex in configuration and is increased in cost.

In view of the above, an object of aspects of the present invention is to provide a screen printing machine which is simplified in configuration and reduced in cost while the quality of a paste print formed on a board is kept high, as well as an electronic component mounting system including the screen printing machine.

According to an aspect of the present invention, there is provided a screen printing machine for forming, on a board, a print of paste supplied to a mask plate having pattern holes in a state where the board contacts the mask plate, the screen printing machine including: a filling squeegee which is held to have a given clearance with respect to the mask plate, and which fills the pattern holes with the paste by moving the filling squeegee relative to the mask plate in a printing direction; an urging member which urges the filling squeegee toward the mask plate such that at least the given clearance is maintained; and a scraping squeegee which is held to maintain a given interval from the filling squeegee in the printing direction, and which scraps off paste remaining on the mask plate after passage of the filling squeegee by moving the scraping squeegee together with the filling squeegee in the printing direction.

According to aspects of the present invention, it is simplify the configuration of machine and reduce the cost thereof while the quality of a paste print formed on a board is kept high.

DETAILED DESCRIPTION

Figure 1:
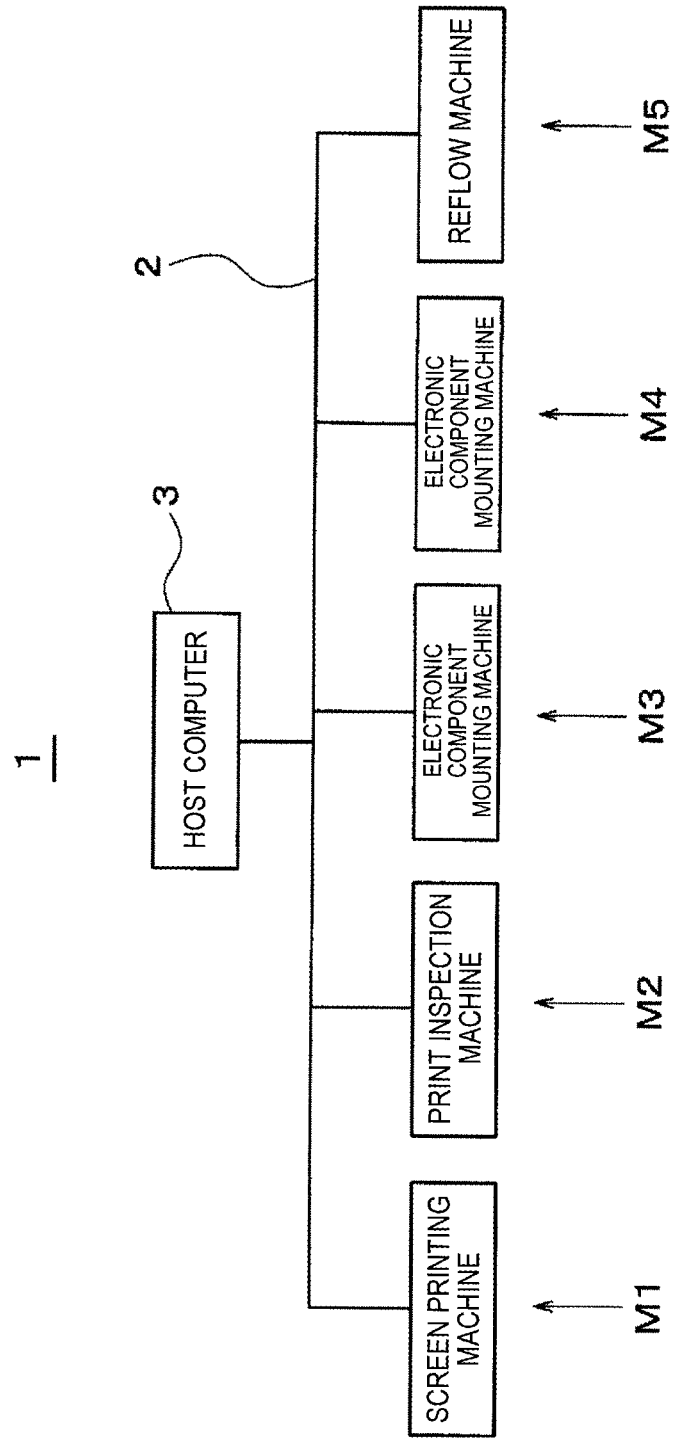
FIG. 1 shows the overall configuration of an electronic component mounting system according to an embodiment of the present invention.

First, the overall configuration of an electronic component mounting system will be described with reference to FIG. 1. The electronic component mounting system 1 has a function of mounting an electronic component on a board via paste such as cream solder. Plural component mounting machines including a screen printing machine M1, a print inspection machine M2, electronic component mounting machines M3 and M4, and a reflow machine M5 are connected together in cascade and connected to each other by a communication network 2 so as to be controlled as a whole by a host computer 3.

The screen printing machine M1 screen-prints paste layers on electronic component joining electrodes formed on a board. The print inspection machine M2 performs print inspection including judgment as to whether or not the paste layers formed on the board are in good print states and detection of deviations of printed paste layers from electrodes. The electronic component mounting machines M3 and M4 mount electronic components on the board on which the paste layers have been formed by the screen printing machine M1. The reflow machine M5 joins the electronic components to the board by melting the solder by heating the electronic-components-mounted board according to a prescribed temperature profile.

Figure 2:
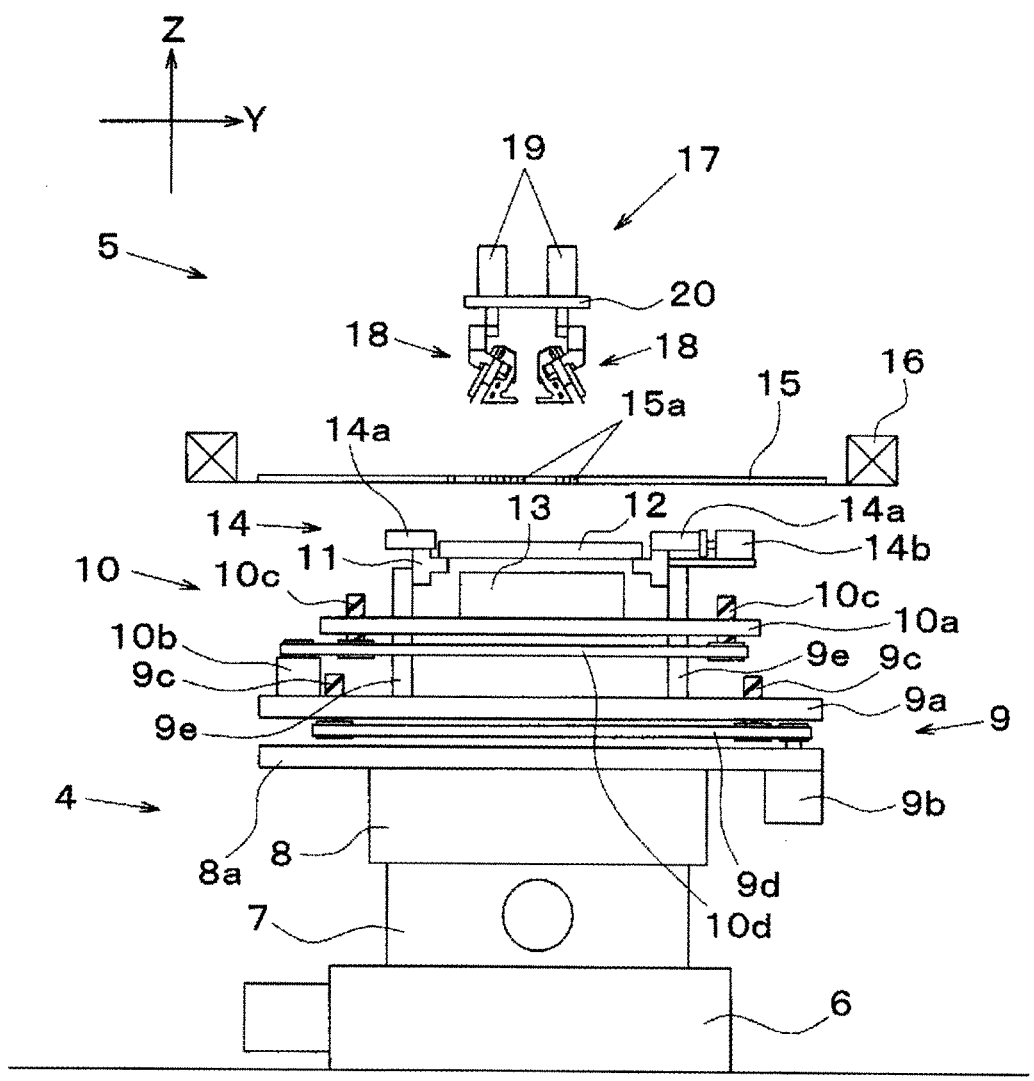
FIG. 2 is a front view of a screen printing machine according to the embodiment of the invention.

Next, the overall configuration of the screen printing machine M1 will be described with reference to FIG. 2 to FIGS. 4A and 4B. As shown in FIG. 2, in the screen printing machine M1, a screen printing mechanism 5 is disposed over a board positioning unit 4. In the board positioning unit 4, a Y-axis table 6, an X-axis table 7, and a θ-axis table 8 are stacked one on another and a combination of a first Z-axis table 9 and a second Z-axis table 10 is disposed on them.

The structure of the first Z-axis table 9 will be described below. A horizontal base plate 9a is held by an elevation guide mechanism (not shown) in an elevatable manner on the side of the top surface of a horizontal base plate 8a which is disposed on the top surface of the θ-axis table 8. The base plate 9a is elevated and lowered by a Z-axis elevation mechanism which rotationally drives plural feed screws 9c with a motor 9b via a belt 9d.

Figure 3:
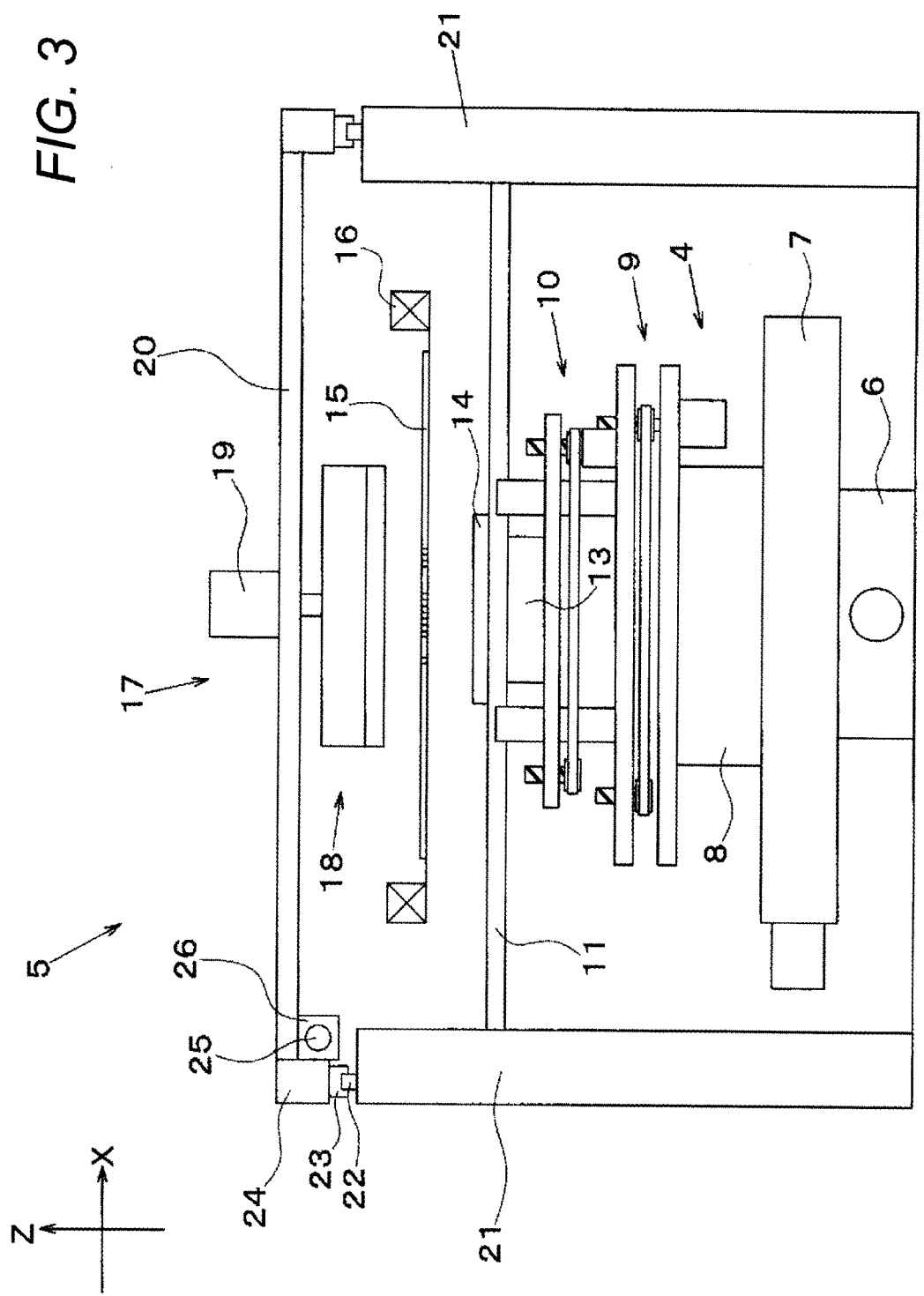
FIG. 3 is a side view of the screen printing machine according to the embodiment of the invention.
Figure 4A:
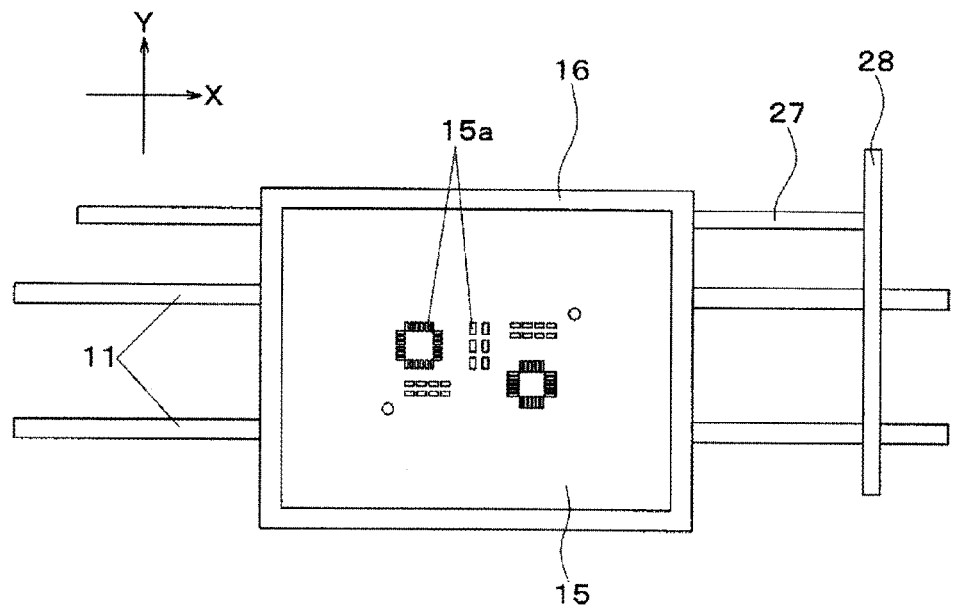
FIGS. 4A and 4B are plan views of parts of the screen printing machine according to the embodiment of the invention.
Figure 4B:
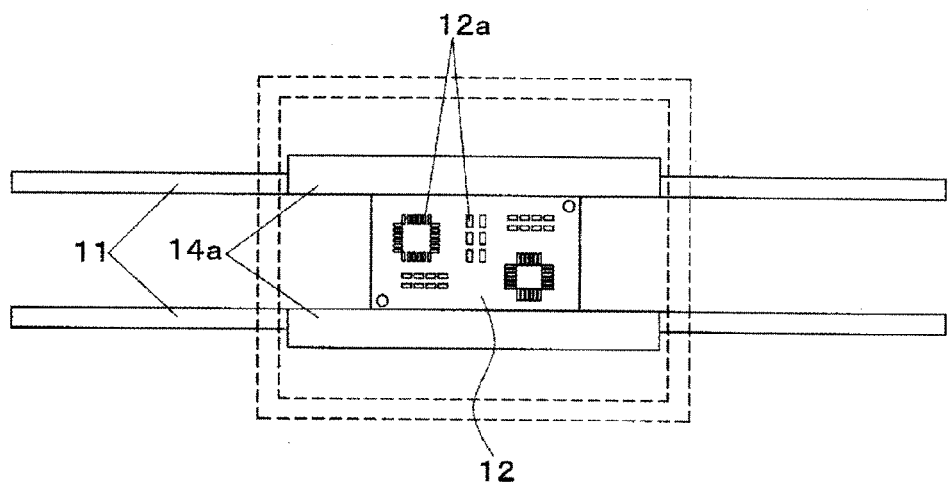

Vertical frames 9e are erected from the base plate 9a and a board conveying mechanism 11 is held by top end portions of the vertical frames 9e. The board conveying mechanism 11 is equipped with two conveyance rails which are disposed parallel with a board conveying direction (in the X direction which is perpendicular to the paper surface of FIG. 1), and a board 12 is conveyed with its two end portions supported by the respective conveyance rails. By driving the first Z-axis table 9, the board 12 being held by the board conveying mechanism 11 can be elevated or lowered with respect to the screen printing mechanism 5 together with the board conveying mechanism 11. As shown in FIG. 3 and FIGS. 4A and 4B, the board conveying mechanism 11 extends to the upstream side (left side in FIG. 3 and FIGS. 4A and 4B) and to the downstream side. The board 12 which has been carried in from the upstream side is conveyed by the board conveying mechanism 11 and then positioned by the board positioning unit 4. After being subjected to printing by the screen printing mechanism 5, the board 12 is carried out to the downstream side by the board conveying mechanism 11.

Next, the structure of the second Z-axis table 10 will be described. A horizontal base plate 10a is disposed between the board conveying mechanism 11 and the base plate 9a so as to be elevatable along an elevation guide mechanism (not shown). The base plate 10a is elevated and lowered by a Z-axis elevation mechanism which rotationally drives plural feed screws 10c with a motor 10b via a belt 10d. A board receiving member 13 whose top surface is a receiving surface for holding the substrate 12 is disposed on the top surface of the base plate 10a.

By driving the second Z-axis table 10, the board receiving member 13 can be elevated or lowered with respect to the board 12 being held by the board conveying mechanism 11. The receiving surface of the board receiving member 13 comes into contact with the bottom surface of the board 12 and thereby supports the board 12 from below. A clamp mechanism 14 is disposed on the top surfaces of the board conveying mechanism 11. The clamp mechanism 14 is equipped with two clamp members 14a which are opposed to each other in the left-right direction. The board 12 is fixed being pressed from both sides by advancing one clamp member 14a by means of the drive mechanism 14a.

Next, a description will be made of the screen printing mechanism 5 which is disposed over the board positioning unit 4. As shown in FIGS. 2 and 3, the screen printing mechanism 5 is equipped with a mask plate 15 which is stretched within a mask frame 16. Pattern holes 15a are formed through the mask plate 15 in such shapes and at such positions as to correspond to print target electrodes 12a of the board 12 (see FIGS. 4A and 4B). A squeegee head 17, which is disposed over the mask plate 15, has a structure that two squeegee elevation mechanisms 19 for elevating and lowering respective squeegee units 18 are disposed on a horizontal plate 20.

Figure 6:
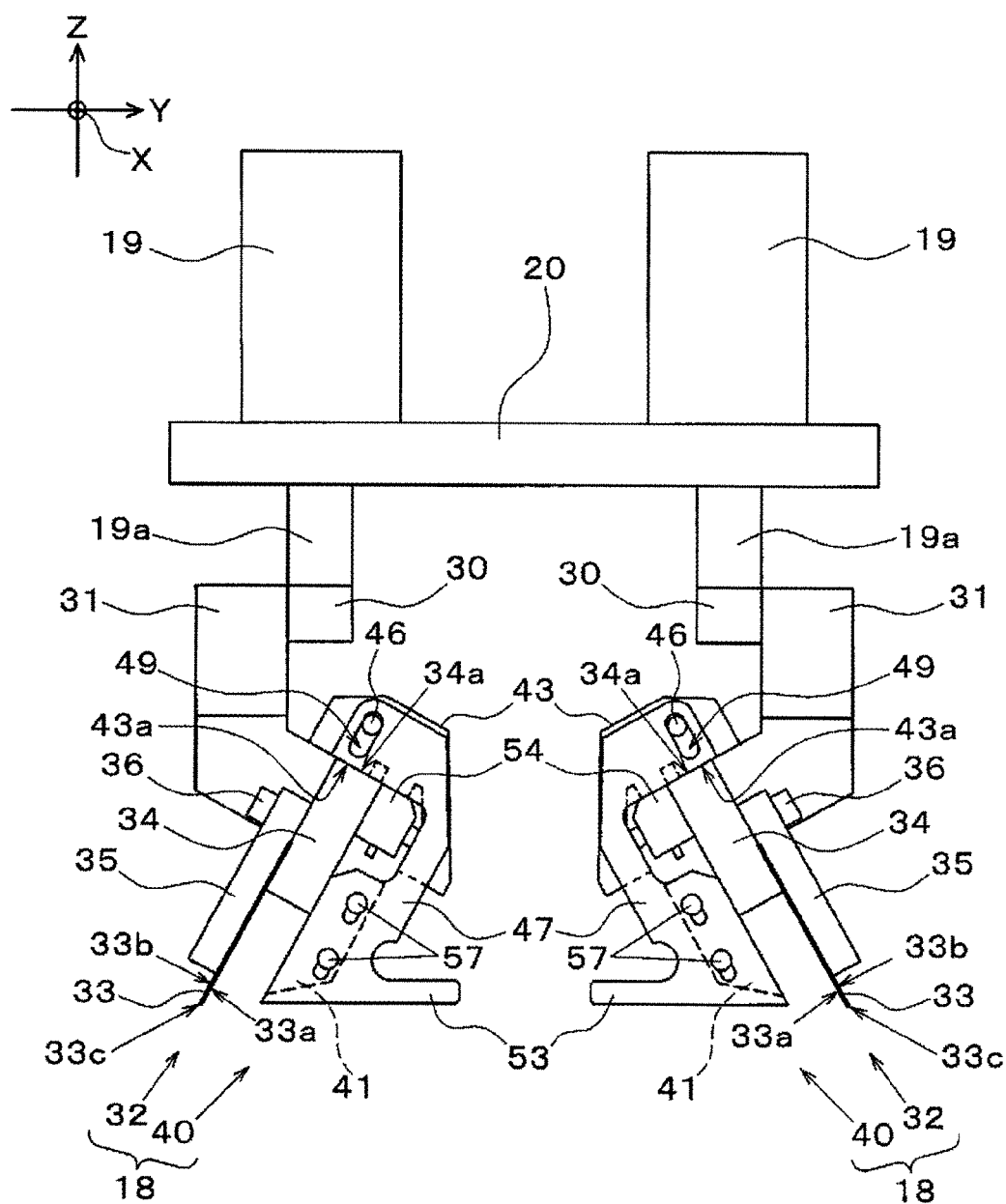
FIG. 6 is a side view of squeegee units provided in the screen printing machine according to the embodiment of the invention.

As shown in FIG. 6, the two squeegee elevation mechanisms 19 which are disposed on the top surface of the horizontal plate 20 have respective elevation shafts 19a which extend downward. And block-shaped attachment members 30 are connected to bottom end portions of the elevation shafts 19a, respectively. The squeegee units 18 are attached to the attachment members 30 via brackets 31, respectively. Details of the squeegee units 18 will be described later.

As shown in FIG. 3, guide rails 22 are disposed on respective vertical frames 21 so as to extend in the Y direction. And sliders 23 which are fitted with the respective guide rails 22 slidably are connected to the two ends of the plate 20 via blocks 24, respectively. With this structure, the squeegee head 17 can slide in the Y direction. The plate 20 is moved horizontally in the Y direction by a squeegee head moving means which consists of a nut 26, a feed screw 25, and a squeegees moving motor (not shown) which rotationally drives the feed screw 25.

As shown in FIGS. 4A and 4B, a head X-axis moving mechanism 27 and a head Y-axis moving mechanism 28 are disposed on the side of the bottom surface of the mask plate 15 and a camera unit and a cleaning unit (neither of which are shown) are attached to the head X-axis moving mechanism 27. The camera unit is equipped with a mask recognition camera for shooting the bottom surface of the mask plate 15 and a board recognition camera for shooting the board 12, and is moved horizontally by the head X-axis moving mechanism 27 and the head Y-axis moving mechanism 28. Likewise, the cleaning unit is moved horizontally by the head X-axis moving mechanism 27 and the head Y-axis moving mechanism 28 and thereby cleans the bottom surface of the mask plate 15 by means of cleaning paper.

Figure 5:
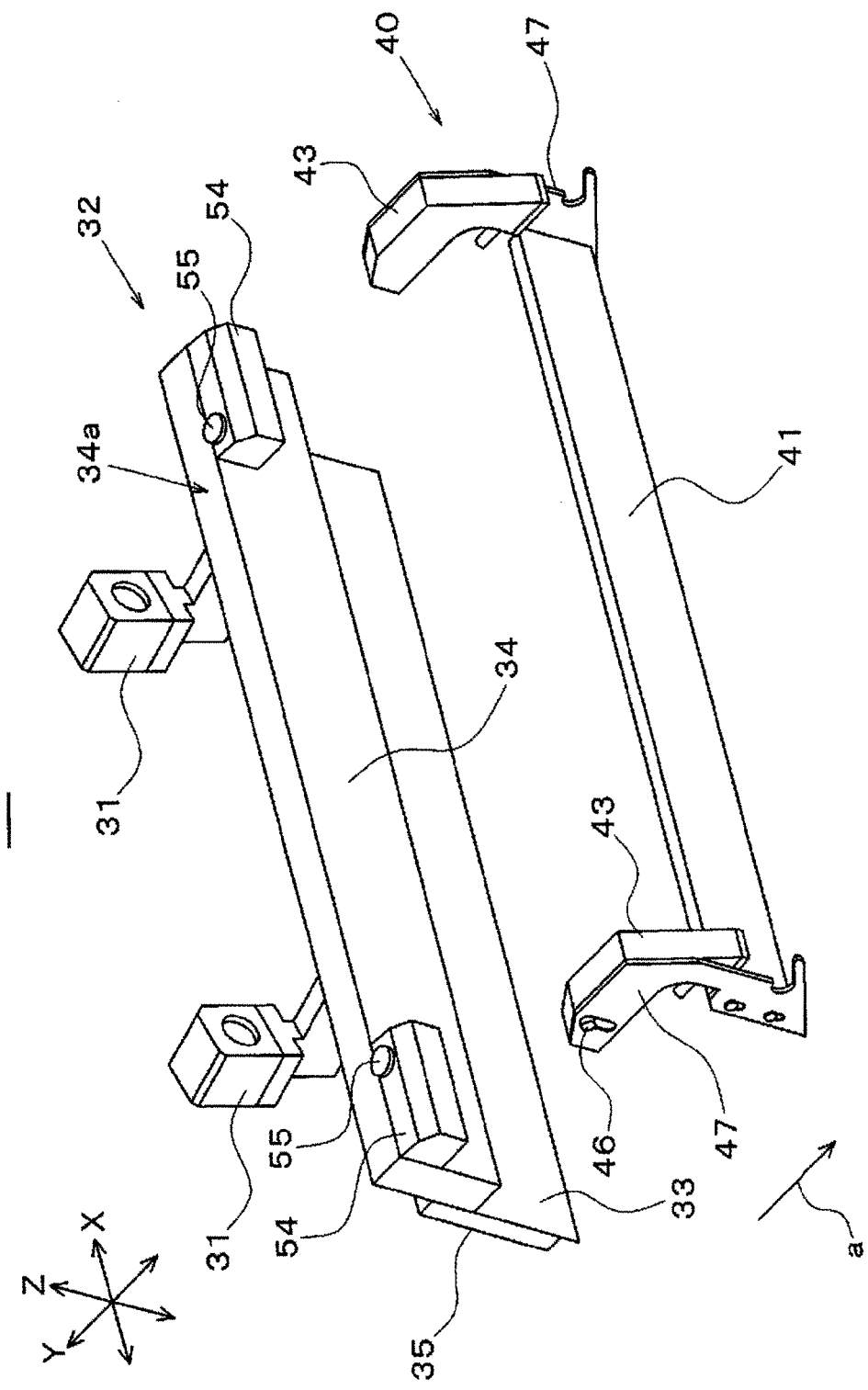
FIG. 5 is a perspective view of one squeegee unit provided in the screen printing machine according to the embodiment of the invention.

Next, the structures of the squeegee units 18 of the squeegee head 17 will be described with reference to FIG. 5 to FIGS. 12A and 12B. As shown in FIGS. 5 and 6, each squeegee unit 18 is composed of a first squeegee unit 32 having a scraping squeegee 33 and a second squeegee unit 40 having a filling squeegee 41. The scraping squeegee 33 and the filling squeegee 41 are moved together in a printing direction by the squeegee head moving means. The scraping squeegee 33 and the filling squeegee 41 are elevated or lowered relative to the mask plate 15 by driving the corresponding squeegee elevation mechanism 19, which is an elevating/lowering means for elevating and lowering the scraping squeegee 33 and the filling squeegee 41.

The first squeegee unit 32 has a first member 34 and a second member 35 which are inclined (overhang) in an advancement direction (printing direction; indicated by arrow "a" in FIG. 5) in which the scraping squeegee 33 is moved on the mask plate 15 during a squeegeeing operation. The first member 34 and the second member 35 are rectangular members which extend in the X direction which is perpendicular to the squeegeeing direction. The first member 34 is located downstream of the second member 35 in the advancement direction of the scraping squeegee 33. The brackets 31 are connected to top portions of the first member 34. The second member 35 is fastened to the first member 34 with bolts 36 (FIGS. 6 and 7A) so as to be located a prescribed distance below the first member 34.

Figure 7A:
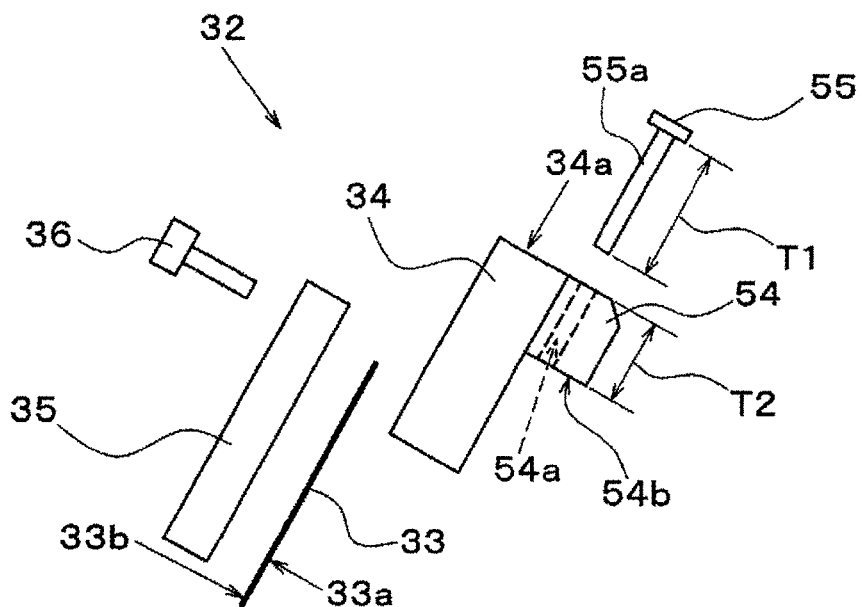
FIGS. 7A and 7B are exploded views of a first squeegee unit and a second squeegee unit provided in the screen printing machine according to the embodiment of the invention.

As shown in FIGS. 6 and 7A, the scraping squeegee 33 is held being sandwiched between the first member 34 and the second member 35. Therefore, the scraping squeegee 33 is also inclined (overhang) in the squeegeeing direction. The first member 34 and the second member 35 function as a scraping squeegee holder which holds the scraping squeegee 33 and is connected to the corresponding squeegee elevation mechanism 19 via the brackets 31 and the attachment member 30. The second member 35 functions as a backup member which is in contact with a back surface 33$b$ (located on the upstream side in the squeegeeing direction) of the scraping squeegee 33 and supports the scraping squeegee 33 from the back surface 33$b$ side during a squeegeeing operation. In the embodiment, that surface of the scraping squeegee 33 which is located on the downstream side in the direction in which it advances during a squeegeeing operation is defined as a front surface 33$a$ and its surface opposite to the front surface 33$a$ is defined as the back surface 33$b$.

As shown in FIG. 6, part of the scraping squeegee 33 projects downward relative to the second member 35. The scraping squeegee 33 is a rectangular member extending in the X direction and is made of such a material as a metal or plastic. The scraping squeegee 33 scrapes off paste on the mask plate 15 as its bottom end 33$c$ slides across the mask plate 15 while being kept in contact with the top surface of the mask plate 15.

As shown in FIGS. 6, 7B, 8A and 8B, and 9, the second squeegee unit 40 has two attachment members 43 for attachment to the first squeegee unit 32. Bottom surfaces 43$a$ of the attachment members 43 and the top surface 34$a$ of the above-described first member 34 are fastening surfaces for fastening of the first squeegee unit 32 and the second squeegee unit 40. The second squeegee unit 40 is fastened to the first squeegee unit 32 by fastening the attachment members 43 to the first member 34 with bolts 44 (see FIG. 9) in a state that the bottom surfaces 43$a$ of the attachment members 43 are in contact with the top surface 34$a$ of the first member 34.

One side surface of each attachment member 43 is formed with a recess 43$b$ (see FIGS. 7B, 8B, and 9) which extends approximately vertically from the bottom surface 43$a$. A spring 45 (urging member) is placed (hung) in the recess 43$b$. A projection 46 is formed beside the recess 43$b$ on the same side surface of the attachment member 43 as is formed with the recess 43$b$.

Figure 7B:
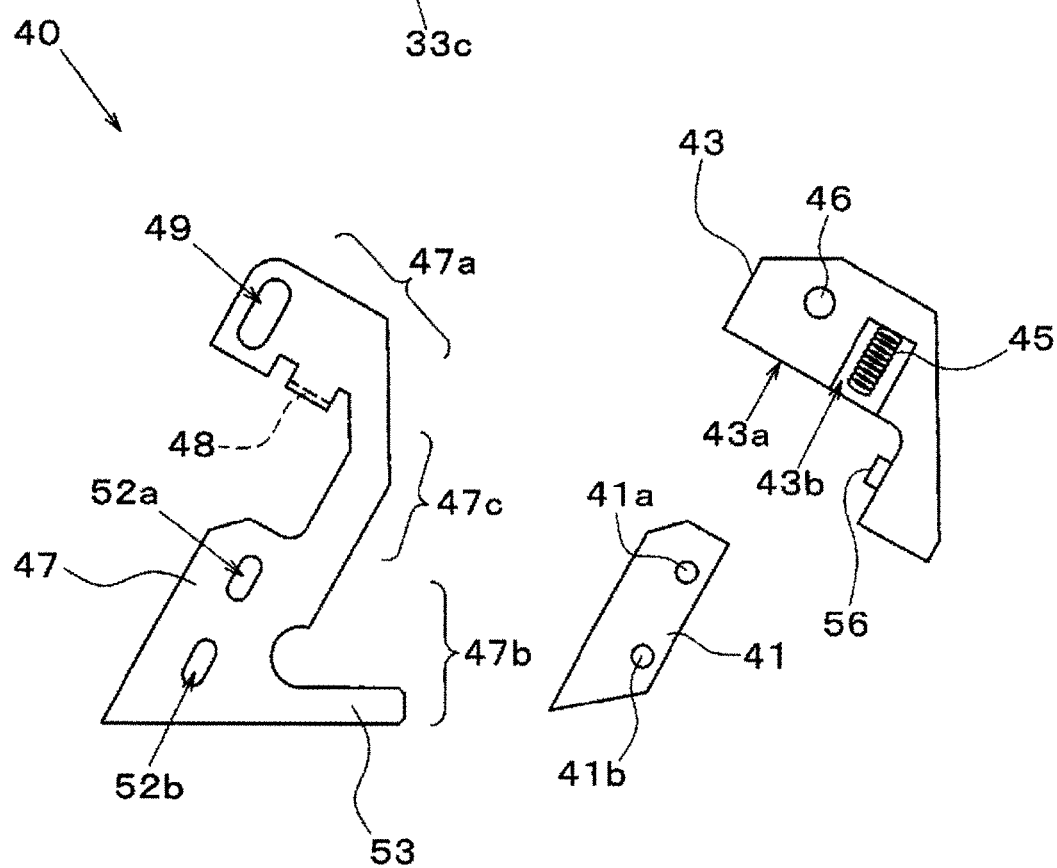

Next, filling squeegee holders 47 which are attached to the respective attachment members 43 will be described in detail. As shown in FIG. 7B, the filling squeegee holders 47, which are holding members for holding the filling squeegee 41, each include an attachment connection portion 47$a$ and a squeegee holding portion 47$b$ which are connected by a connection portion 47$c$. The filling squeegee holders 47 are made of a metal such as SUS.

A flat-plate-shaped projection 48 is formed in such a manner as to adjoin the recess 43$b$ of the associated attachment member 43 and project from a bottom end portion of the attachment connection portion 47$a$ of each filling squeegee holder 47 toward the attachment member 43 in a state that the filling squeegee holder 47 is attached to the attachment member 43. The spring 45 is located over the projection 48 and pushes down the projection 48 to urge the filling squeegee holder 47 downward.

An opening 49 which extends approximately vertically is formed through the attachment connection portion 47$a$ at such a position as to correspond to the projection 46 of the associated attachment member 43. The width of the opening 49 is approximately equal to the diameter of the projection 46. The filling squeegee holder 47 is connected to the attachment member 43 so as to be slidable approximately in the vertical direction relative to the attachment member 43 by fitting the projections 46 and 48 into the opening 49 and the recess 43$b$, respectively.

Figure 9:
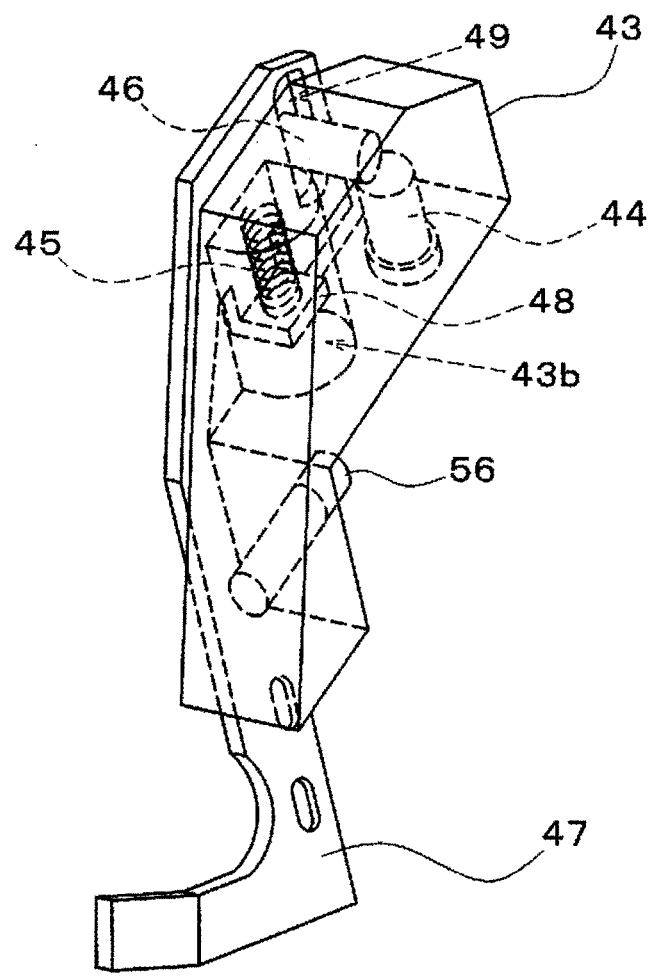
FIG. 9 is a perspective view of the second squeegee unit provided in the screen printing machine according to the embodiment of the invention.
Figure 10:
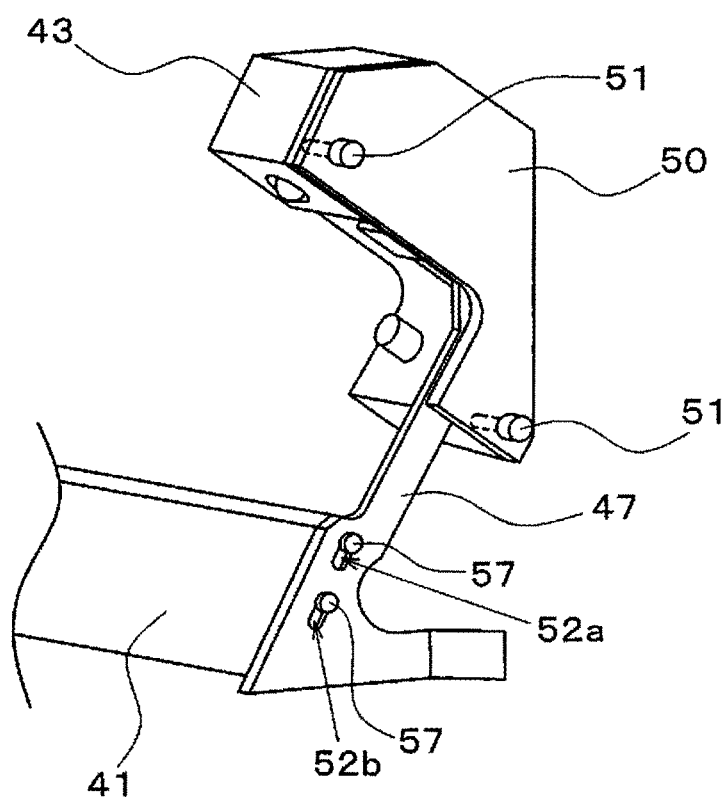
FIG. 10 is another perspective view of the second squeegee unit provided in the screen printing machine according to the embodiment of the invention.

To attach the filling squeegee holder 47 to the attachment member 43, a plate-like member 50 for covering part of the side surface of the attachment member 43 is prepared (see FIG. 10). The attachment connection portion 47$a$ is sandwiched between the attachment member 43 and the plate-like member 50 in a state that the projections 46 and 48 are fitted in the opening 49 and the recess 43$b$, respectively. In this state, the plate-like member 50 is fastened to the attachment member 43 with bolts 51 which are inserted at such positions (end positions of the attachment member 43) as not to obstruct sliding of the filling squeegee holder 47. For the sake of convenience, the plate-like member 50 and bolts 51 are omitted in FIGS. 5 to 9.

Figure 8A:
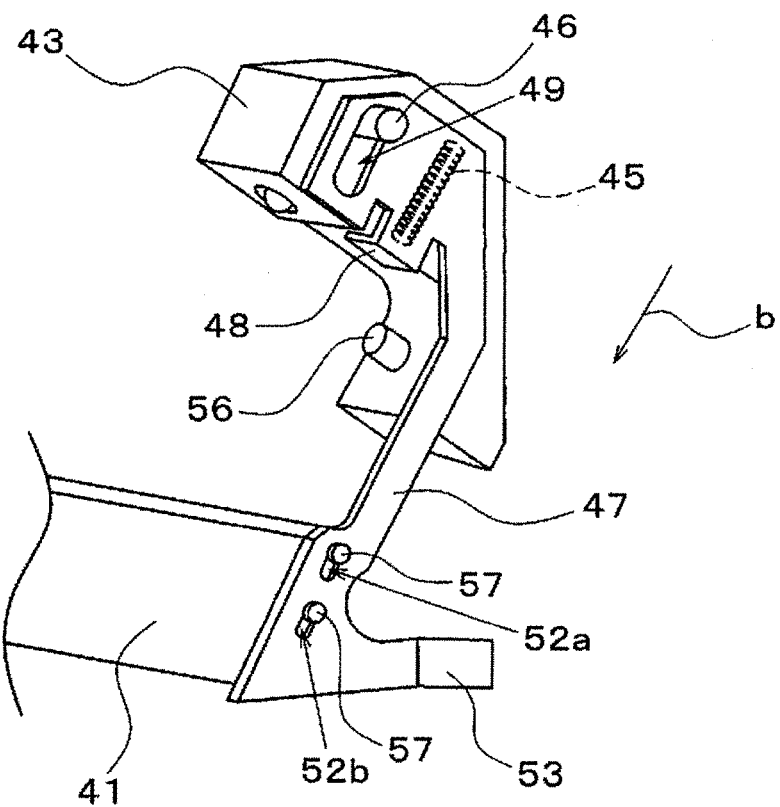
FIGS. 8A and 8B are perspective views of the second squeegee unit provided in the screen printing machine according to the embodiment of the invention.
Figure 8B:
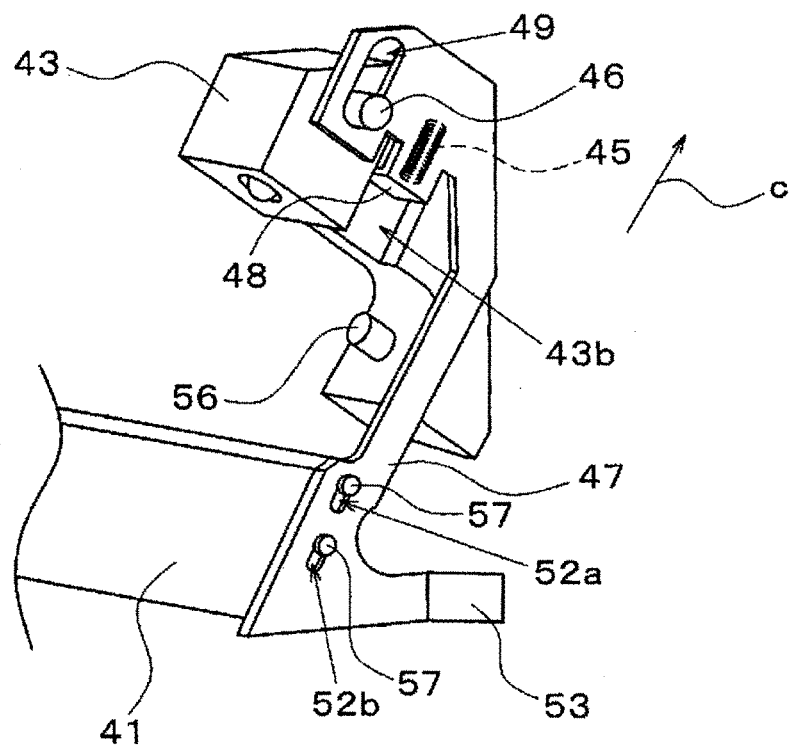

As shown in FIG. 7B and FIGS. 8A and 8B, attachment holes 52$a$ and 52$b$ are formed through the squeegee holding portion 47$b$ so as to extend approximately vertically. Each of side surfaces, in the width direction, of the filling squeegee 41 is formed with screw holes 41$a$ and 41$b$. The filling squeegee 41 is held by the filling squeegee holders 47 by positioning the filling squeegee 41 and the squeegee holding portion 47$b$ of each filling squeegee holder 47 with respect to each other and screwing plural screws 57 (see FIGS. 8A and 8B) into the screw holes 41$a$ and 41$b$ through the attachment holes 52$a$ and 52$b$, respectively. The filling squeegee 41 is a rectangular member extending in the X direction and is made of such a material as a metal or plastic. The filling squeegee 41 has a function of filling the pattern holes 15$a$ of the mask plate 15 with paste. As shown in FIG. 6, the filling squeegee 41 and the scraping squeegee 33 are held so as to be spaced from each other by a prescribed distance in the squeegeeing direction and the filling squeegee 41 is located downstream of the scraping squeegee 33 in the squeegeeing direction.

As shown in FIG. 8A, when each filling squeegee holder 47 is pushed down by the spring 45 (indicated by arrow "b") in a state that the filling squeegee 41 is held by the filling squeegee holders 47, the filling squeegee 41 goes down being guided by the opening 49 via the filling squeegee holders 47 and stops when the projection 46 hits the top end (stroke end) of the opening 49. On the other hand, as shown in FIG. 8B, when each filling squeegee holder 47 is pushed up while compressing the spring 45 (indicated by arrow "c"), the filling squeegee 41 goes up being guided by the opening 49 via the filling squeegee holders 47 and stops when the projection 46 hits the bottom end (stroke end) of the opening 49.

As seen from the above description, the projection 46 and the opening 49 serve as a filling squeegee guiding means for guiding the filling squeegee 41 approximately vertically over a prescribed stroke. While the filling squeegee 41 assumes an ordinary posture without being pushed up externally, the filling squeegee holder 47 takes such a posture that the projection 46 is in contact with the top end of its opening 49 (see FIGS. 6 and 8A).

The squeegee holding portion 47b has an extension 53 which projects in the squeegeeing direction at the bottom. Setting is made so that the bottom end of the squeegee holding portion 47b including the bottom end of the extension 53 is located at the same height as the bottom end 33c of the scraping squeegee 33 in a state that the filling squeegee 41 assumes the ordinary posture. The extension 53 functions as a damming means for preventing a phenomenon that paste flows out of the mask plate 15 going around the side edge of the filling squeegee 43 during a squeegeeing operation.

Figure 11A:
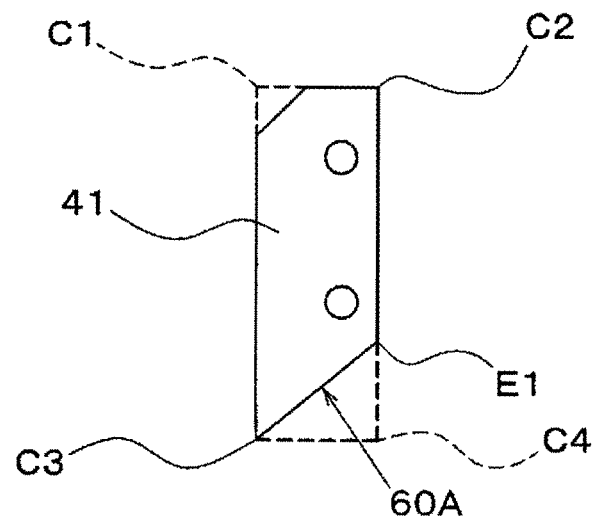
FIG. 11A is a side view of a filling squeegee provided in the screen printing machine according to the embodiment of the invention.

Next, a sectional shape of the filling squeegee 41 will be described with reference to FIGS. 11A and 11B. As shown in FIG. 11A, the filling squeegee 41 has a vertical sectional view that is obtained by cutting away diagonal corner portions including the corners C1 and C4 of a rectangular basic shape having four corners C1, C2, C3, and C4. As a result, a corner-cut surface 60A is formed which is defined by an edge corresponding to the corner C3 and an apex E1. Alternatively, the corner portion including the corner C1 may be left without being cut away.

Figure 11B:
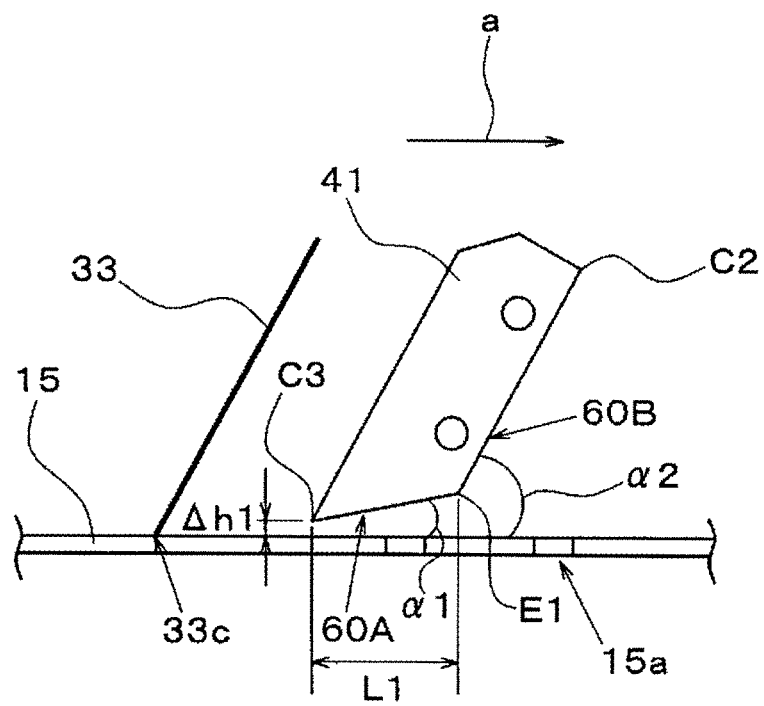
FIG. 11B is a simplified side view of one squeegee unit provided in the screen printing machine according to the embodiment of the invention.

FIG. 11B shows a state that the scraping squeegee 33 and the filling squeegee 41 are incorporated in one squeegee unit 18. For the sake of convenience, the other members are omitted in FIG. 11B. As shown in FIG. 11B, when the filling squeegee 41 is held by the filling squeegee holder 47, the corner-cut surface 60A is inclined from the mask plate 15 so as to form an angle $\alpha1$ with it and to go up as the position goes in the squeegeeing direction. A non-corner-cut surface 60B which is defined by the edge E1 and the edge corresponding to the corner C2 is inclined from the mask plate 15 so as to form an angle $\alpha2$ with it and to go up as the position goes in the squeegeeing direction. The angles $\alpha1$ and $\alpha2$ are acute angles.

When the filling squeegee 41 is slid over the mask plate 15, the pattern holes 15a are filled with paste while its flow passage is narrowed gradually as the position goes along the non-corner-cut surface 60B and the corner-cut surface 60A in the direction opposite to the squeegeeing direction. The corner-cut surface 60A and the non-corner-cut surface 60B are a first filling surface and a second filling surface, respectively, for filling the pattern holes 15a of the mask plate 15 with paste. The filling squeegee 41 is formed with the plural (two) filling surfaces which form different angles with the top surface of the mask plate 15.

In a squeegeeing operation, the filling time of filling the pattern holes 15a with paste P can be made longer by increasing the length L1, in the squeegeeing direction, of the corner-cut surface 60A which is a closest surface to the mask plate 15. In the following description, the angle $\alpha1$ which is formed by the corner-cut surface 60A and the top surface of the mask plate 15 will be referred to as a "filling angle" and the angle $\alpha2$ which is formed by the non-corner-cut surface 60B and the top surface of the mask plate 15 will be referred to as an "attack angle."

The holding position of the filling squeegee 41 with respect to the filling squeegee holder 47 is set so that in a state that the filling squeegee 41 assumes the ordinary posture its corner C3 which is the lowest point of the filling squeegee 41 is higher than the bottom end 33c of the scraping squeegee 33 by $\Delta h1$. More specifically, the screws 57 are screwed into the screw holes 41a and 41b through the attachment holes 52a and 52b, respectively, in a state that the filling squeegee 41 is located at such a position that the corner C3 of the filling squeegee 41 is higher than the bottom end 33c of the scraping squeegee 33 by $\Delta h1$. Therefore, when the bottom end 33c of the scraping squeegee 33 is brought into contact with the mask plate 15 by lowering one squeegee unit 18 by the corresponding squeegee elevation mechanism 19, a clearance of $\Delta h1$ is obtained between the filling squeegee 41 and the mask plate 15. The spring 45 urges the filling squeegee 41 toward the mask plate 15 in such a manner that at least the prescribed clearance of $\Delta h1$ is maintained. A paste printing operation is performed in this state using the filling squeegee 41 and the scraping squeegee 33. How a printing operation is performed will be described later.

Figure 12A:
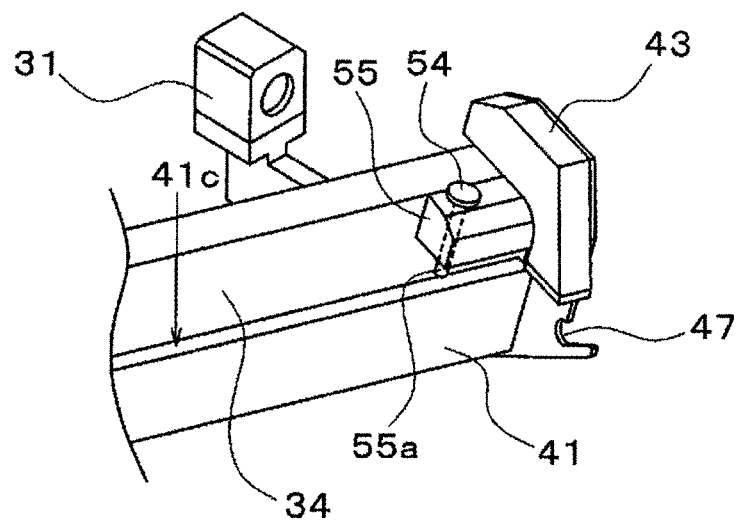
FIG. 12A is a perspective view of part of one squeegee unit provided in the screen printing machine according to the embodiment of the invention.

Next, a height adjustment mechanism for adjusting the upper limit height of the filling squeegee 41 when the filling squeegee 41 is pushed up will be described with reference to FIG. 7A and FIGS. 12A and 12B. Top portions of the surface, opposed to the filling squeegee 41, of the first member 34 is provided with respective screw holders 54. A screw hole 54a penetrates through each screw holder 54 approximately vertically and a screw 55 is threadedly engaged with the screw hole 54a. For example, the screw 55 is a knurled screw whose head is formed with slip-preventive streaks. As shown in FIG. 7A, the length T1 of a threaded shank 55a is greater than the penetration length T2 of the screw hole 54a. The height adjustment mechanism includes the screw holders 54 and the screws 55.

In a state that the first squeegee unit 32 and the second squeegee unit 40 are fastened to each other, a bottom surface 54b, having the bottom opening of the screw hole 54a, of each screw holder 54 is located over a top surface 41c of the filling squeegee 41. Therefore, when the filling squeegee 41 is pushed up, the bottom surface 54b of the screw holder 54 or the bottom end of the threaded shank 55a of the screw 55 comes into contact with a top surface 41c of the filling squeegee 41 and thereby restricts upward movement of the filling squeegee 41.

Figure 12B:
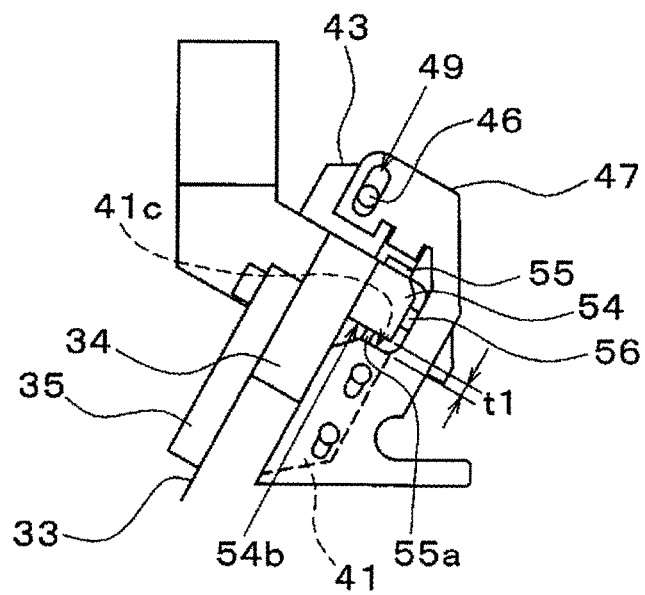
FIG. 12B is a side view of the one squeegee unit shown in FIG. 12A.

As shown in FIG. 12B, the possible upward displacement (push-up height) of the filling squeegee 41 can be decreased by increasing the projection length of the threaded shank 55a from the bottom surface 54b of the screw holder 54. In this manner, the upper limit of the upward displacement of the filling squeegee 41 can easily be adjusted in accordance with the type of a manufacturing subject board, the paste characteristics, etc. by varying the projection length t1 of the threaded shank 55a from the bottom surface 54b of the screw holder 54.

As seen from the above description, the screws 55 serve as stoppers for restricting displacement of the filling squeegee 41 in such a direction that it goes away from the mask plate 15. The screw holders 54 serve as fixing members for fixing the stoppers over the filling squeegee 41. The fixing position of each stopper above the filling squeegee 41 can be adjusted by the corresponding fixing member.

The attachment member 43 is formed with a pin-shaped contact portion 56 at such a position as to be opposed to the screw holder 54 (also see FIG. 9). Being in contact with the side surface of the screw holder 54, the contact portion 56 prevents shakes of the second squeegee unit 40 in a state that the first squeegee unit 32 and the second squeegee unit 40 are fastened to each other.

The configuration of the screen printing machine M1 according to the embodiment has been described above. Next, a printing operation will be described with reference to FIGS. 13A and 13B. The following printing operation is performed as a control unit (not shown) of the screen printing machine M1 controls the individual drive mechanisms.

Figure 13A:
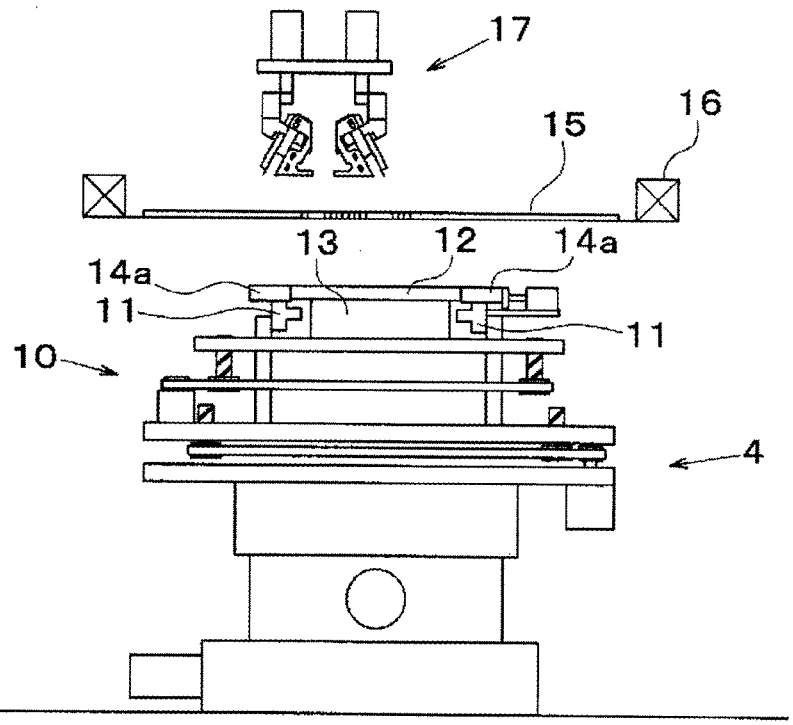
FIGS. 13A and 13B illustrate how a printing operation is performed by the screen printing machine according to the embodiment of the invention.

First, as soon as a board 12 is carried in to a prescribed printing position by the board conveying mechanism 11, as shown in FIG. 13A the control unit drives the second Z-axis table 10 to elevate the board receiving member 13 and has it receive the bottom surface of the board 12 from below. In this state, the control unit causes the clamp members 14a to press the board 12 from both sides and thereby fix it and drives the board positioning unit 4 to position the board 12 with respect to the mask plate 15.

Figure 13B:
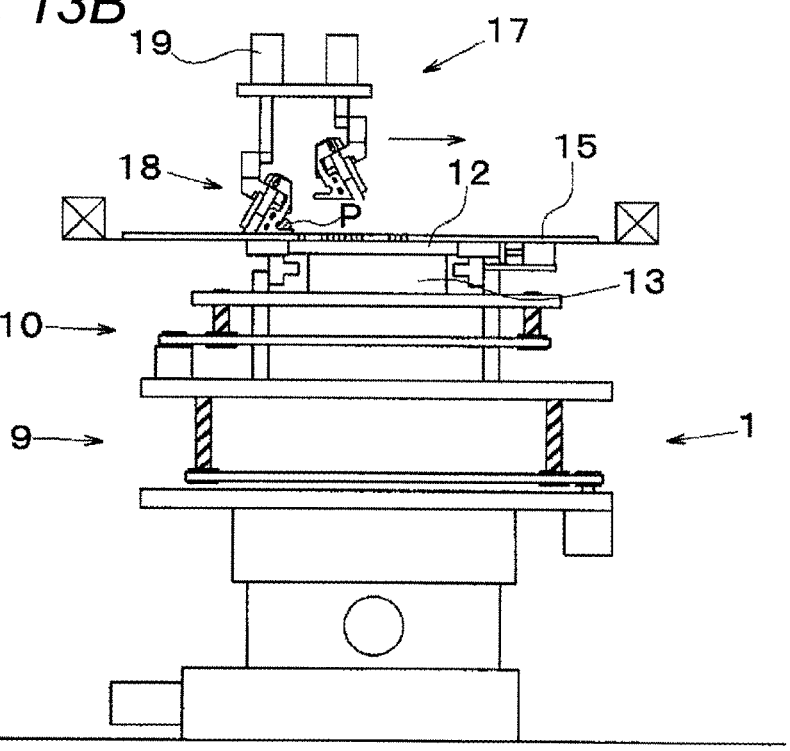

Subsequently, as shown in FIG. 13B, the control unit drives the first Z-axis table 9 to elevate the board 12 together with the board receiving member 13 and bring the board 12 into contact with the bottom surface of the mask plate 15. In this state, the control unit causes one squeegee unit 18 to lower and causes a squeegeeing operation in which the filling squeegee 41 and the scraping squeegee 33 slide in the printing direction (squeegeeing direction) on the mask plate 15 which has been supplied with paste P. As a result, a print of paste P is formed on the board 12 through the pattern holes 15a. In this manner, the screen printing machine M1 forms a print of paste P supplied to the mask plate 15 in a state that the board 12 is in contact with the mask plate 15 having the pattern holes 15a.

Figure 14:
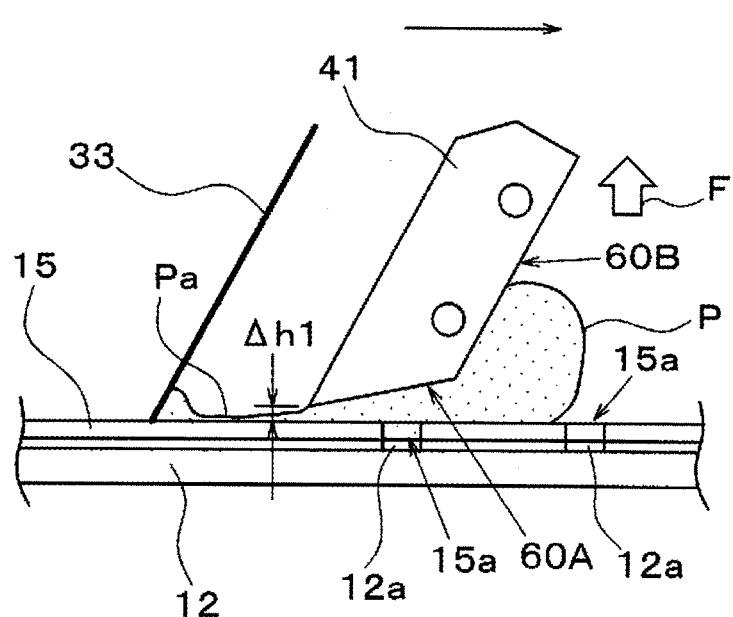
FIG. 14 illustrates how the filling squeegee behaves in a squeegeeing operation in the embodiment of the invention.

In a printing operation, as shown in FIG. 14, the filling squeegee 41 is held by the filling squeegee holders 47 in a state that it has a clearance of $\Delta h1$ with respect to the top surface of the mask plate 15. The filling squeegee 41 slides on the top surface of the mask plate 15 while a filling angle $\alpha 1$ and an attack angle $\alpha 2$ are maintained. As the filling squeegee 41 advances, paste P that is captured by the filling squeegee 41 is pushed into the pattern holes 15a while receiving rolling action that renders it flowable in a rotation direction and its flow passage is narrowed gradually as the position goes along the non-corner-cut surface 60B and the corner-cut surface 60A in the direction opposite to the squeegeeing direction. That is, in the printing operation, the pattern holes 15a are filled with paste P by moving, relative to the mask plate 15 in the printing direction, the filling squeegee 41 which is held in such a manner that at least the prescribed clearance $\Delta h1$ is secured with respect to the mask plate 15.

As described above, since the flow passage area of paste P is decreased gradually, the filling pressure that occurs in filling paste P into the pattern holes 15a is increased, whereby a sufficient amount of paste P can be supplied to the electrodes 12a (print targets) of the board 12. Since the filling squeegee 41 has the corner-cut surface 60A, the filling time of filling the pattern holes 15a with (by pushing) paste P can be increased, a sufficient amount of paste P can be supplied to the electrodes 12a of the board 12 even in the case of high-speed printing.

During a printing operation, a part (denoted by symbol Pa), not having been pushed into the pattern holes 15a by the filling squeegee 41, of the paste P flows out through the clearance $\Delta h1$. Since the printing operation is performed in the state that the clearance $\Delta h1$ is formed, the ability to filling the pattern holes 15a with paste P can be increased further. The paste Pa that has flown out through the clearance $\Delta h1$ is scraped off by the scraping squeegee 33. That is, the scraping squeegee 33 scrapes off the paste Pa remaining on the mask plate 15 after passage of the filling squeegee 41.

During a printing operation, the filling squeegee 41 receives, via the paste P, force (reaction force) F that serves to push it up. Since the filling squeegee 41 is urged downward by the springs 45, the filling squeegee 41 moves in the printing direction while its position relative to the mask plate 15 varies according to the amount of paste P captured by itself (i.e., the magnitude of the reaction force received by it) and the states (e.g., warp and inclination) of the top surface of the mask plate 15.

As described above, since a printing operation is performed with the filling squeegee 41 urged downward, reduction of the paste filling pressure is prevented and hence good print quality can be secured. Furthermore, since it is not necessary to employ an inspection device for electrically detecting reaction force that acts on the filling squeegee 41 using a central processing unit (control unit) unlike in the conventional case, the configuration of the screen printing machine M1 can be simplified and the machine cost can thereby be lowered while the quality of a paste print formed on a board 12 is kept high.

Still further, the clearance $\Delta h1$ in the initial state can be changed by adjusting the screwing positional relationship between the attachment holes 52a and 52b formed in the squeegee holding unit 47b of each filling squeegee holder 47 and the screwing holes 41a and 41b formed in the filling squeegee 41.

Next, modifications that relate to the sectional shape of the filling squeegee will be described with reference to FIGS. 15A-15C. Filling squeegees 41A, 41B, and 41C are formed by cutting away prescribed corner portions of the plate-like member having, as a vertical sectional shape, the rectangular basic shape shown in FIG. 11A that has the corners C1-C4 (and further cutting away a portion including a resulting apex).

Figure 15A:
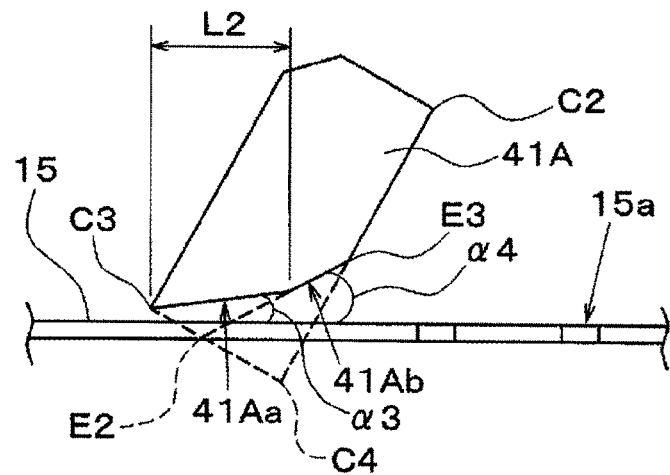
FIGS. 15A-15C are side views of filling squeegees according to modifications of the embodiment of the invention.

The filling squeegee 41A shown in FIG. 15A is obtained by cutting away corner portions including the respective corners C1 and C4 and further cutting away a portion including one resulting apex by a line connecting a point E2 on the side connecting the corners C3 and C4 and a point E3 on the side connecting the corners C2 and C4. As a result of the above cutting, the filling squeegee 41A provides a third filling surface 41Aa which is inclined from the mask plate 15 by an angle (filling angle) $\alpha 3$ and a fourth filling surface 41Ab which is inclined from the mask plate 15 by an angle (attack angle) $\alpha 4$.

Figure 15B:
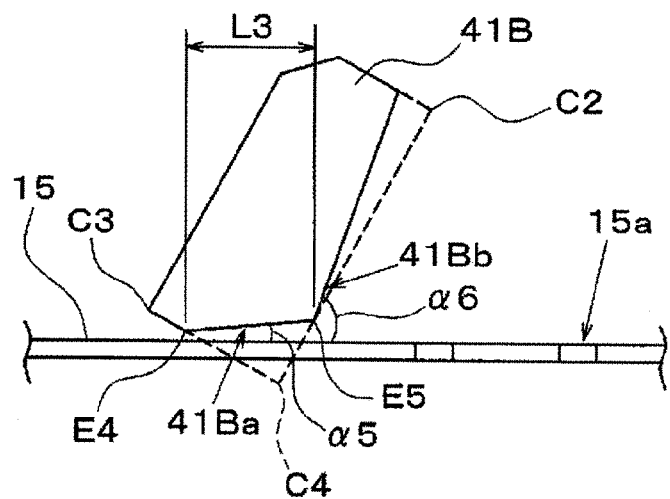

The filling squeegee 41B shown in FIG. 15B is obtained by cutting away corner portions including the respective corners C1 and C4 and further cutting away a corner portion including the corner C2 by a line connecting a resulting apex E5 on the side connecting the corners C2 and C4 and a point on the side connecting the corners C1 and C2. As a result of the above cutting, the filling squeegee 41B provides a fifth filling surface 41Ba which is inclined from the mask plate 15 by an angle (filling angle) $\alpha 5$ and a sixth filling surface 41Bb which is inclined from the mask plate 15 by an angle (attack angle) $\alpha 6$.

Figure 15C:
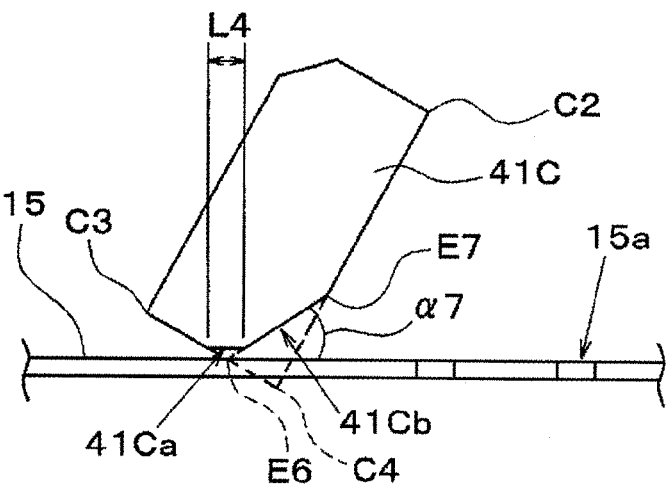

The filling squeegee 41C shown in FIG. 15C is obtained by cutting away corner portions including the respective corners C1 and C4 and further cutting away a portion including a resulting apex E6 by a line connecting a point on the side connecting the corners C3 and C4 and a point on the side connecting the corners C2 and C4. As a result of the above cutting, the filling squeegee 41C provides a seventh filling surface 41Ca which is parallel with the mask plate 15 (the filling angle is equal to 0° and an eighth filling surface 41Cb which is inclined from the mask plate 15 by an angle (attack angle) $\alpha 7$.

In the above-described manners, filling surfaces having various sizes and various filling angles and attack angles can be obtained by cutting away desired corner portions of the rectangular basic shape (vertical sectional shape) and further cutting away a portion including a resulting apex. It is noted that a sufficient amount of paste P can be supplied to the electrodes 12a of a board 12 by increasing the filling time of filling the pattern holes 15a with paste P by increasing the lengths L1, L2, L3, and L4 in the squeegeeing direction of the filling surfaces (corner-cut surfaces 60A, third filling surface 41Aa, fifth filling surface 41Ba, and seventh filling surface 41Ca) each of which forms the filling angle with the top surface of the mask plate 15.

Capable of simplifying the machine configuration and lowering the machine cost while keeping the quality of a paste print formed on a board high, aspects of the invention is particularly useful when applied to the field of electronic component mounting.

What is claimed is:

1. A screen printing machine for forming, on a board, a print of paste supplied to a mask plate having pattern holes in a state where the board contacts the mask plate,
said screen printing machine comprising:
a filling squeegee which is held to have a given clearance with respect to the mask plate, and which fills the pattern holes with the paste by moving the filling squeegee relative to the mask plate in a printing direction;
an urging member which urges the filling squeegee toward the mask plate such that at least the given clearance is maintained;
a scraping squeegee which is held to maintain a given interval from the filling squeegee in the printing direction, and which scraps off paste remaining on the mask plate after passage of the filling squeegee by moving the scraping squeegee together with the filling squeegee in the printing direction; and
an attachment which attaches the filling squeegee to the scraping squeegee,
wherein the attachment comprises a recess extending approximately vertically from a bottom surface of the attachment, and the urging member is placed in the recess.

2. The screen printing machine according to claim 1, wherein during a printing operation, the filling squeegee is moved in the printing direction while a position of the filling squeegee relative to the mask plate is varied by the spring being compressed and extended by force received from the paste.

3. The screen printing machine according to claim 1, further comprising a stopper which sets an upper limit of a displacement of the filling squeegee toward a direction away from the mask plate.

4. The screen printing machine according to claim 3, wherein a fixing position of the stopper above the filling squeegee is adjustable.

5. An electronic component mounting system comprising:
the screen printing machine according to claim 1; and
an electronic component mounting machine which mounts an electronic component on the board on which the print of paste has been formed by the screen printing machine.

6. The screen printing machine according to claim 1, wherein the attachment comprises the urging member, and, wherein the filling squeegee is attached to the scraping squeegee via the urging member.

* * * * *